United States Patent [19]

Van de Plassche et al.

[11] Patent Number: 4,502,017
[45] Date of Patent: Feb. 26, 1985

[54] OPERATIONAL AMPLIFIER HAVING FREQUENCY COMPENSATION

[75] Inventors: Rudy J. Van de Plassche; Eise C. Dijkmans, both of Eindhoven, Netherlands

[73] Assignee: U.S. Philips Corporation, New York, N.Y.

[21] Appl. No.: 452,569

[22] Filed: Dec. 23, 1982

[30] Foreign Application Priority Data

Oct. 19, 1982 [NL] Netherlands .......................... 8204024

[51] Int. Cl.$^3$ ............................................... H03F 1/14
[52] U.S. Cl. .................................... 330/151; 330/107; 330/260; 330/292; 330/294

[58] Field of Search ................. 330/76, 107, 151, 253, 330/260, 294, 307, 292

[56] References Cited

U.S. PATENT DOCUMENTS 4,405,900 9/1983 Van De Plassche ............... 330/151

Primary Examiner—James B. Mullins
Attorney, Agent, or Firm—Thomas A. Briody; William J. Streeter; Edward W. Goodman

[57] ABSTRACT

An operational amplifier with frequency compensation is described. The amplifier includes a first amplifier with a low-impedance output followed by a transconductance amplifier with a capacitive feed-forward. The transconductance amplifier is followed by a Miller integrator.

2 Claims, 5 Drawing Figures

OPERATIONAL AMPLIFIER HAVING FREQUENCY COMPENSATION

BACKGROUND OF THE INVENTION

The invention relates to an operational amplifier comprising at least a first amplifier stage, a second amplifier stage driven by the first amplifier stage, and a first and a second junction point, a first capacitive signal path for improving the high-frequency properties of the operational amplifier being arrangeable or arranged between said junction points, which first junction point is coupled to an output of the first amplifier stage and which second junction point is coupled to an output of the second amplifier stage, the gain from the first junction point to the second junction being noninverting and the impedance of the output of the second amplifier being high relative to the impedance of the first juntion point.

Such an operational amplifier is known from U.S. patent application Ser. No. 252,483, filed Apr. 8, 1981, and now U.S. Pat. No. 4,405,900 which is herewith incorporated by reference. This known operational amplifier comprises a voltage amplifier having a low-impedance output (the first amplifier stage) followed by a transconductance amplifier (the second amplifier stage) across which a high-frequency feed-forward path (the first capacitive signal path) is arranged. This enables frequency compensation to be applied to the operational amplifier in order to obtain a 6 dB/octave roll-off without a loss of bandwidth because the 0-dB bandwidth of the operational amplifier is equal to the 0-dB bandwidth of the first amplifier stage as a result of this compensation. In addition, this known operational amplifier has the advantage that via said capacitive signal path, the high-impedance output of the second amplifier stage is loaded by the low-impedance output of the first stage for high frequencies, so that the high-frequency noise of this operational amplifier is reduced.

SUMMARY OF THE INVENTION

In practice, it is found to be desirable that an additional amplifier stage can be added to this known operational amplifier in order to limit the signal-voltage sweep on the output of the transconductance amplifier (the second stage), which results in a reduced distortion, or in order to increase the gain. The invention aims at providing an operational amplifier of the type mentioned in the opening paragraph which is equipped with an additional amplifier stage but whose excellent frequency-compensation is retained. To this end the invention is characterized in that the output of the second amplifier stage is connected to an input of a third amplifier stage having an output coupled to a third junction point, a second capacitive signal path being arrangeable or arranged between the second and the third junction point, which third amplifier stage is inverting between the second and the third junction point so that said third amplifier stage in conjunction with the second capacitive signal path exhibits a Miller effect.

The invention is based on the recognition that, although the addition of a further stage will generally cancel the frequency compensation as a result of an additional roll-off in gain leading to a 12 dB/octave roll-off, this does not happen in operational amplifiers of the type mentioned in the opening paragraph when a Miller integrator is arranged after the capacitive feed-forward transconductance amplifier as a third stage. It is then found that, in the same way as the second stage in the known amplifier, the second and the third stage together exhibit a 6 dB/octave roll-off. After a path with a 6 dB/octave roll-off, the gain of the second and the third stage together appears to become frequency-independent since the two capacitive signal paths function as a high-frequency signal inverter because the second junction point acts as a virtual ground for the third amplifier stage. Thus, in the same way as in the known operational amplifier, it is possible to bring the roll-off of the first amplifier stage in conformity with the roll-off of the second stage in combination with the third stage, so that a 6 dB/octave roll-off up to the 0-dB point is maintained.

As regards the two capacitive signal paths the invention may further be characterized in that capacitances of substantially equal magnitude are arranged between the second and the third junction point and between the first and the second junction point.

DESCRIPTION OF THE DRAWINGS

The invention will now be described in more detail, by way of example, with reference to the drawings, in which.

DESCRIPTION OF THE PREFERRED EMBODIMENT

Figure 1:
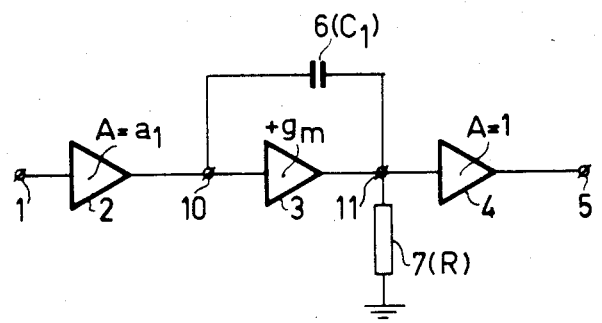
FIG. 1 shows a known operational amplifier.

FIG. 1 shown the frequency-compensated amplifier known from U.S. patent application Ser. No. 252,483 filed Apr. 8, 1981, and now U.S. Pat. No. 4,405,900, to which the inventive step may be applied. Between an input 1 and an output 5 the amplifier comprises a first amplifier stage 2, which is a voltage amplifier having a gain $A = a_1$ and an output 10 with a comparatively low impedance, followed by a transconductance amplifier 3 having a transconductance $g_m$ and an output 11 with a comparatively high impedance. The transconductance amplifier 3 is terminated by a resistor 7 with a resistance R, which resistor 7 may be the equivalent input resistance of a following stage, and is shunted by a capacitor 6 with a capacitance $C_1$. Alternatively, the capacitor 6 may be arranged between the output 11 of the transconductance amplifier 3 and a low-impedance output of the amplifier 2 other than the output which is connected to the transconductance amplifier. The transconductance amplifier 3 may be followed by a voltage follower or an output stage 4 having a gain $A = 1$.

Figure 2:
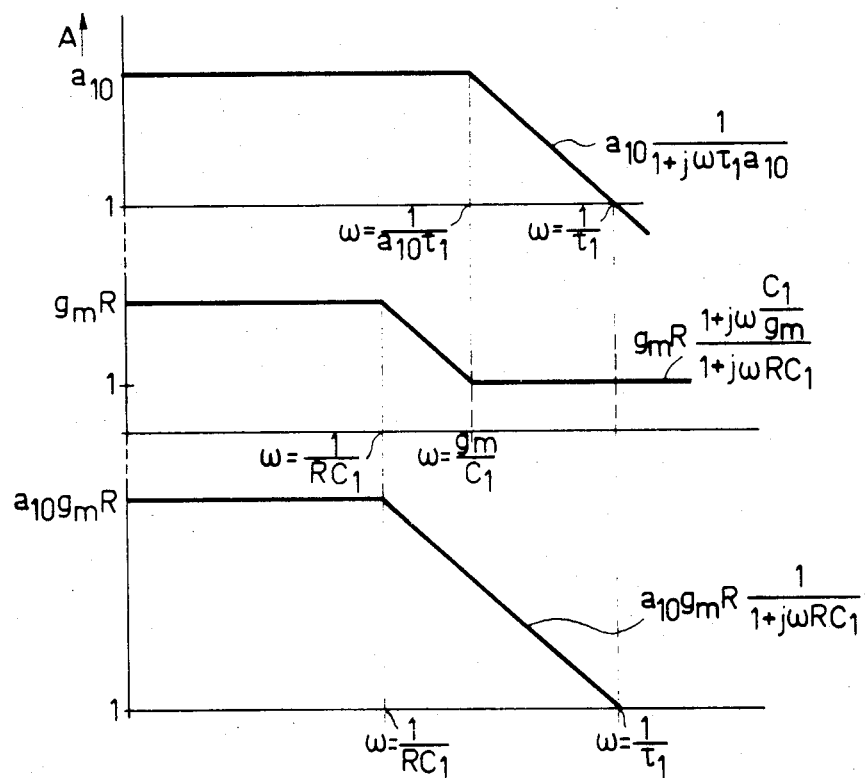
FIG. 2 shows three frequency-response curves to illustrate the operation of the operational amplifier shown in FIG. 1.

In order to illustrate the effect of the frequency compensation of the amplifier shown in FIG. 1, FIG. 2 shows three frequency diagrams representing, from top to bottom, the gain of the first amplifier stage 2, the gain of the transconductance amplifier 3 with the capacitor 6 and the resistor 7, and the gain of the complete amplifier as a function of the angular frequency $\omega$ on a logarithmetic scale. The gain of the voltage amplifier 2 may be written as:

$$a_{10} \frac{1}{1 + j\omega\tau_1 a_{10}}$$

where $a_{10}$ is the gain at low frequencies and $\tau_1$ is the time constant of the frequency roll-off of the gain of the first stage 2. As is shown in FIG. 2, this means that the roll-off of this first stage 2 becomes 6 dB/octave at $$\omega = \frac{1}{a_{10}\tau_1}$$

and that for $\omega = (1/\tau_1)$, a gain of 0 dB is reached.

The open-loop gain of the second stage 3 is $g_m R$, i.e. the product of the transconductance and the terminating resistance. For higher frequencies a current via the capacitor 6 produces a voltage across the resistor 7 and for very high frequencies the capacitor 6 forms a short circuit, so that the gain is unity. The gain as a function of the angular frequency is:

$$g_m R \frac{1 + j\omega \frac{C_1}{g_m}}{1 + j\omega R C_1}$$

As is shown in FIG. 2, this is a characteristic having a gain $g_m R$ for low frequencies, a 6 dB/octave roll-off starting at $\omega = 1/RC_1$ and changing to a constant gain of unity for $\omega = g_m/C_1$. A requirement for the foregoing is that the time constant of the transconductance amplifier 3 is smaller than the time constant $C_1/g_m$.

A 6 dB/octave roll-off further than the 0 dB-gain point for the overall gain can be obtained by bringing the frequency roll-off of the first amplifier stage exactly in conformity with that the second stage, i.e. by ensuring that $(1/a_{10}\tau_1) = (g_m/C_1)$. This results in the transfer characteristic shown in FIG. 2 with an overal gain of $$a_{10} g_m R \frac{1}{1 + j\omega R C_1}$$

This is a characteristic with a gain $a_{10} g_m R$ for low frequencies, a break point for $\omega = 1/RC_1$, a 6 dB/octave roll-off and a 0 dB gain for $\omega = (1/\tau_1)$. This yields an additional gain $(g_m R)$ without adversely affecting the frequency response of the first stage (i.e.) while maintaining the 6 dB/octave roll-off past the point where the gain is unity and at which point the angular frequency is equal to $\omega = (1/\tau_1)$. Moreover, this frequency compensation has the additional advantage that outside the frequency band $(1/\tau_1)$ where the gain $A = 1$, the noise on the high-impedance output of the transconductance amplifier 3 is short-circuited to the low-impedance output 10 of the voltage amplifier 2 via the capacitor 6 and does not appear on output 5 of the amplifier.

In many cases it is desirable to add a third amplifying stage 8, not only to obtain additional gain but also to limit the voltage swing on the output of the transconductance amplifier so as to reduce the distortion, because in practice a transconductance amplifier generally produces more distortion than a voltage amplifier for the same voltage swing on its output. This higher distortion arises inter alia the output of a transconductance amplifier is generally the collector of a transistor, which is loaded by a comparatively high voltage-dependent stray collector-capacitance, for said distortion being caused by the voltage dependence of this capacitance.

Figure 3:
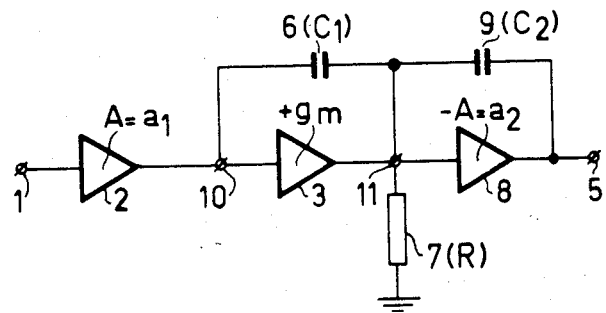
FIG. 3 shows the circuit diagram of an operational amplifier in accordance with the invention.

In FIG. 3 the transconductance amplifier stage 3 of an operational amplifier as shown in FIG. 1 is followed, in accordance with the invention, by a voltage amplifier 8 with a voltage gain $A = a_2$. In accordance with the invention, this voltage amplifier is operated as a Miller integrator via a capacitor 9 having a capacitance $C_2$.

Figure 4:
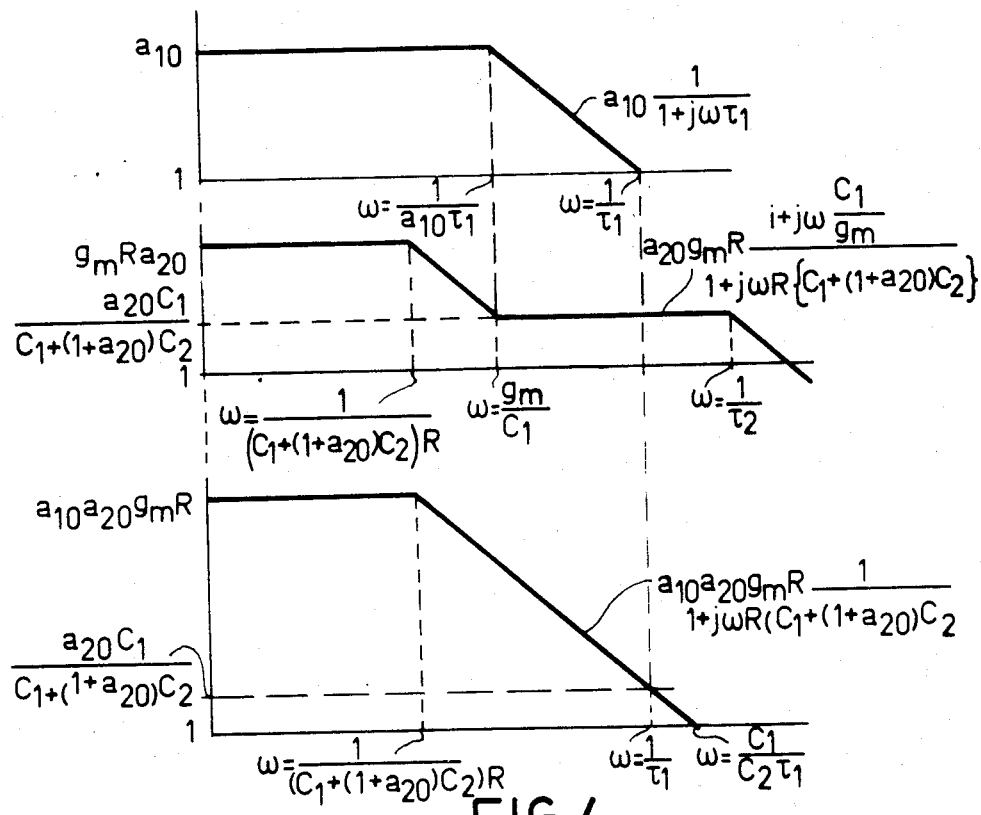
FIG. 4 shows three frequency-response curves to explain the operation of the operational amplifier shown in FIG. 3.

In order to explain the frequency compensation achieved by means of the amplifier in accordance with the invention, FIG. 4 shows, from top to bottom, the gain of the first amplifier stage 2, the gain of the combination of the second (3) and third (8) amplifier stage together with the capacitors 6 and 9 and the resistor 7, and the gain of the complete amplifier as a function of the angular frequency $\omega$ on a logarithmic scale.

The gain of the first amplifier stage 2 remains the same:

$$a_{10} \frac{1}{1 + j\omega\tau_1}$$

which yields a frequency response with a low-frequency gain $a_{10}$, a break point for $\omega = (1/a_{10}\tau_1)$, a 6 dB/octave roll-off, and a gain of 0 dB for $\omega = (1/\tau_1)$.

The second and the third stages do not operate independently of each other and must be regarded as one amplifier. For low frequencies the output current of the high-impedance transconductance amplifier only flows through the resistor 7 and the amplifier 8 acts as a voltage amplifier, so that the gain of the two is equal to $g_m R_{20}$, where $a_{20}$ is the low-frequency gain of the amplifier 8. For higher frequencies, a signal current flow via capacitor 6 and capacitor 9 also plays a part for higher frequencies. It is possible to calculate that the break point is situated at $$\omega = \frac{1}{\{C_1 + (1 + a_{20})C_2\}R}$$

From this point the roll-off in gain is 6 dB/octave because the capacitors 6 and 9 give rise to one time constant with capacitor 6 in parallel with capacitor 9 whose capacitances is increased by the Miller effect, which time constant $$\tau = \{C_1 + (1 + a_{20})C_2\}R$$

which is equal to $a_{20}C_2R$ for $a_{20} >> 1$ and for $a_{20}C_2 >> C_1$. For even higher frequencies the capacitors 6 and 9 will have a very low impedance. If point 11 remain virtual ground, which is the case if the roll-off of amplifier 8 is not yet too strong, the output voltage $V_{10}$ on output 10 is converted into a signal current $j\omega C_1 V_{10}$ by capacitor 6, which signal current is converted via capacitor 9 into a voltage $V_5$ on output 5, which voltage $V_5 = -(C_1/C_2)V_{10}$. The combination of the amplifier stages 3 and 8 with the capacitors 6 and 9 acts as an inverter with a frequency-independent gain $C_1/C_2$. The frequency response thus obtained is shown in FIG. 4 and may be expressed by the formula:

$$A = a_{20}g_m R \frac{1 + j\omega C_1/g_m}{1 + j\omega R\{C_1 + (1 + a_{20})C_2\}}$$

This is a characteristic which—when ignoring the minus sign as a result of the inverting action of the Miller integrator—exhibits a low-frequency gain equal to $g_m Ra_{20}$, which rolls off with 6 dB/octave from $\omega=1/\{C_1+(1+a_{20})C_2\}R$, and for $\omega=g_m/C_1$ changes to a gain equal to $$\frac{a_{20}C_1}{C_1 + (1 + a_{20})C_2}$$

which for $a_{20}>>1$ and $a_{20}C_2>>C_1$ is equal to $C_1/C_2$. For still higher frequencies at $\omega=(1/\tau_2)$, the Miller-integrator effect will be lost because the third stage 8 reaches the 0 dB gain point, so that the gain rolls off further.

The characteristic thus obtained has the same shape as the second characteristic shown in FIG. 2. Thus, by means of the amplifier shown in FIG. 3, frequency compensation is obtained in the same way as with the amplifier shown in FIG. 1—but now by means of three amplifier stages—by linking the first two characteristics in FIG. 4 to each other by selecting $$\frac{1}{a_{20}\tau_1} = \frac{g_m}{C_1}.$$

This yields the characteristic shown at the bottom in FIG. 4, which exhibits a low-frequency gain equal to $a_{10}a_{20}g_m R$, which for $\omega=1/\{C_1+(1+a_{20})C_2\}R$—which for $a_{20}>>1$ and $a_{20}C_2>>C_1$ is equal to $\omega=1/a_{20}C_2R$—changes to a roll-off of 6 dB/octave, and which reaches the gain $C_2/C_1$ for $\omega=1/\tau_1$. The characteristic may be represented by the following formula:

$$a_{10}\, a_{20}\, g_m R \, \frac{1}{1 + j\omega R\{C_1 + (1 + a_{20})C_2\}}$$

which may be reduced to $$a_{10}\, a_{20}\, g_m\, R \, \frac{1}{1 + j\omega a_{20} C_2 R}$$

for $a_{20}>>1$ and $a_{20}C_2>>C_1$.

For $\omega=1/\tau_1$, this characteristic has a gain $C_1/C_2$ and a roll-off of 6 dB/octave, but with an additional gain $a_{20}$. The 0-dB point is reached for $$\omega = \frac{C_1}{C_2\tau_1}$$

It follows that the 0-dB bandwidth $\omega=(1/\tau_2)$ of the third stage 8 should be at least a fraction $C_1/C_2$ larger than the bandwidth $\omega=1/\tau_1$ of the first stage 2 in order to meet the requirement that the break point for $\omega=1/\tau_2$ lies above the 0-dB point of the overall characteristic. As in practice the bandwidth of the third stage 8 cannot be much larger (for example, not a factor 2 larger) than the bandwidth of the first stage, it follows that in practice $C_1/C_2$ will be substantially equal to unity. If the bandwidth of the third stage is inadequate, the bandwidth of the first stage may be reduced or the ratio $C_1/C_2$ may be selected to be smaller than unity.

Figure 5:
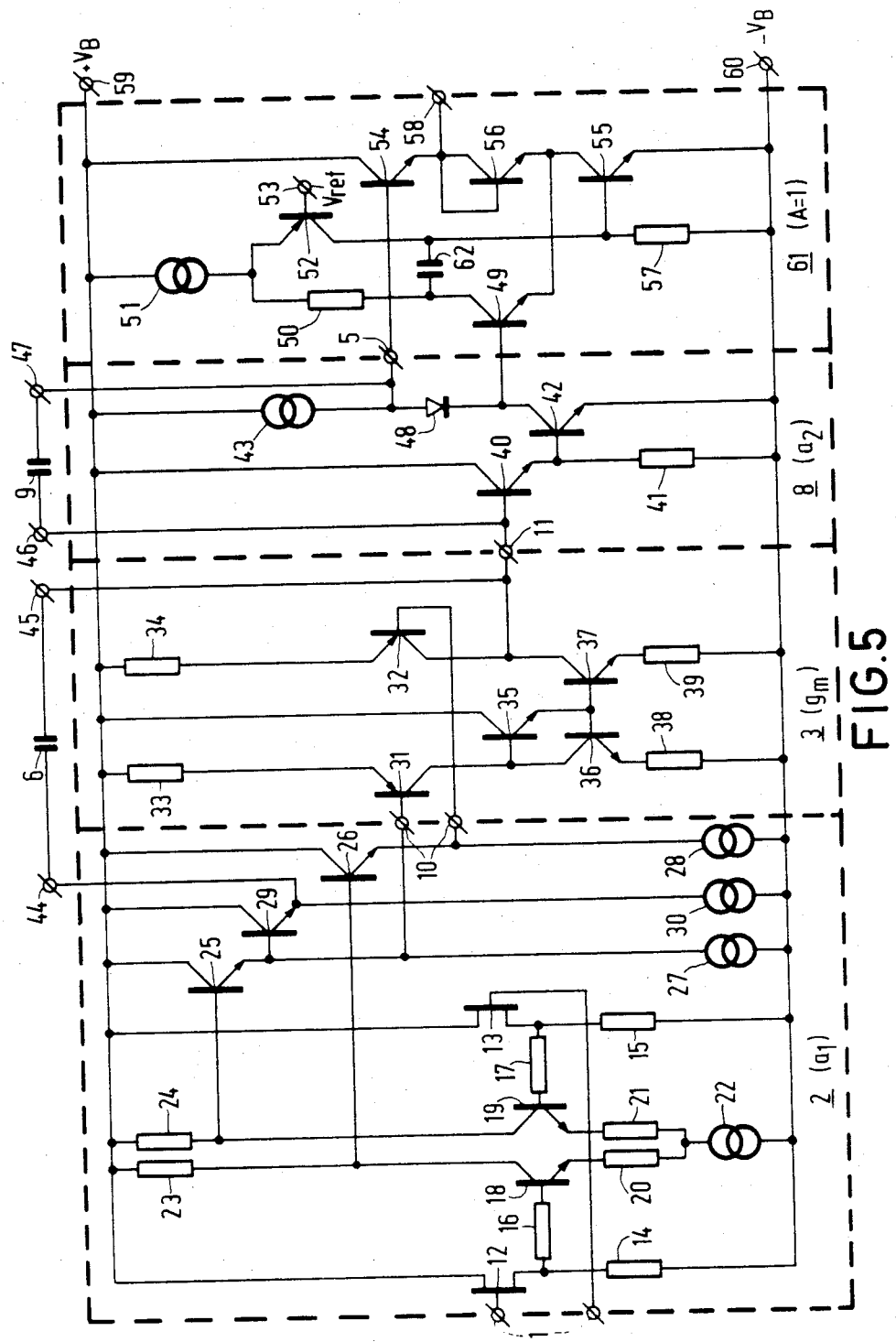
FIG. 5 shows an embodiment of an operational amplifier in accordance with the invention.

FIG. 5 shows an embodiment of the amplifier shown in FIG. 3. The first amplifier stage 2 comprises a pair of FET input transistors 12 and 13, whose gate electrodes form the input 1, whose source electrodes are connected to a power-supply terminal 60 via resistors 14 and 15, respectively, and whose drain electrodes are connected to a power-supply terminal 59. Via resistors 16 and 17, the source electrodes are connected to the base electrodes of two transistors 18 and 19, respectively, which are arranged as a differential pair, whose emitter electrodes are connected to the power-supply terminal 60 via the emitter-degeneration resistors 20 and 21, respectively, and the current source 22. Via resistors 23 and 24, respectively, the collectors are connected to the power-supply terminal 59. The signals across the resistors 23 and 24 are transferred to the differential output 10 of the first amplifier stage 2 via emitter-follower transistors 25 and 26. An emitter-follower transistor 29 is connected to the emitter of transistor 25 in order to obtain a low-impedance point 44 for connection of the capacitor 6.

The second amplifier stage 3—the transconductance amplifier—comprises two transistors 31 and 32 arranged s a voltage-current converter, whose base electrodes are connected to the output 10 and whose emitter electrodes are connected to the power-supply terminal 59 via resistors 33 and 34, respectively. The collector electrode of transistor 32 is connected directly to an output 11 and the collector electrode of transistor 31 is connected to this output via a current mirror comprising the transistors 35, 36 and 37 and the resistors 38 and 39. The output 11 is connected to a terminal 45 for connecting the capacitor 6 and to a terminal 46 for connecting the capacitor 9.

The third amplifier stage 8 comprises a first transistor 40 whose emitter is connected to the base of a transistor 42. Transistor 42 has a current source 43 as its collector load. The collector of transistor 42 is connected to an output 5 and to a terminal 47 for connecting the capacitor 9.

The capacitors 6 and 9 may be integrated with the amplifier stages or, alternatively, they may be external capacitors connected to an pins of the integrated circuit comprising the amplifier stages 2, 3 and 8.

In the same way as in the amplifier shown in FIG. 1, the amplifier shown in FIG. 3 may be extended by a voltage follower or output stage 61 having a gain A=1. For this purpose the embodiment shown in FIG. 5 employs an output stage 61 as described in the previously filed U.S. patent application Ser. No. 252,483, filed Apr. 8, 1981, which stage has suitable high-frequency properties. Instead of this output stage, any other output stage with suitable high-frequency properties may be used.

In the embodiment shown in FIG. 5 the capacitor 9 is connected across the amplifier 8 between output 11 (of amplifier 3) and output 5 of amplifier 8. Alternatively, capacitor 9 may be arranged between the outputs 11 and 58, so that the amplifier 8 and the output stage 61 together operate as a Miller integrator. In many cases this variant has the advantage of a lower distortion.

Although in this embodiment the output 5 and the output 11 of the transconductance amplifier are high-impedance outputs, the problem of increased distortion as a result of said voltage-dependent capacitance is largely mitigated because in this amplifier 8, an output-impedance level may be chosen which is lower than in the transconductance amplifier.

What is claimed is:

1. An operational amplifier comprising at least a first amplifier stage, a second amplifier stage driven by the first amplifier stage, and a first and a second junction point, a first capacitive signal path for improving the high-frequency properties of the operational amplifier between said junction points, which first junction point is coupled to an output of the first amplifier stage and which second junction point is coupled to an output of the second amplifier stage, the gain from the first junction point to the second junction point being non-inverting and the impedance of the output of the second amplifier being high relative to the impedance of the first junction point, characterized in that the output of the second amplifier stage is connected to an input of a third amplifier stage having an output coupled to a third junction point, a second capacitive signal path between the second and the third junction points, which third amplifier stage is inverting between the second and the third junction points, so that said third amplifier stage in conjunction with the second capacitive signal path exhibits a Miller effect.

2. An operational amplifier as claimed in claim 1, characterized in that capacitances of substantially equal magnitude are coupled between the second and the third junction point and between the first and the second junction point.

* * * * *